(12) United States Patent
Jain et al.

(10) Patent No.: US 8,458,541 B2
(45) Date of Patent: Jun. 4, 2013

(54) SYSTEM AND METHOD FOR DEBUGGING SCAN CHAINS

(75) Inventors: Sandeep Jain, Rewari (IN); Nikila Krishnamoorthy, Chennai (IN); Abhishek Chaudhary, Nagpur (IN); Nipun Mahajan, New Delhi (IN); Saurabh Chauhan, Inder Puri (IN)

(73) Assignee: Freescale Semiconductor, Inc., Austin, TX (US)

( * ) Notice: Subject to any disclaimer, the term of this patent is extended or adjusted under 35 U.S.C. 154(b) by 220 days.

(21) Appl. No.: 13/071,512

(22) Filed: Mar. 25, 2011

(65) Prior Publication Data

US 2012/0246531 A1 Sep. 27, 2012

(51) Int. Cl.
*G01R 31/28* (2006.01)

(52) U.S. Cl.
USPC .......................................... 714/729; 714/726

(58) Field of Classification Search
USPC ................................................. 714/729, 726
See application file for complete search history.

(56) References Cited

U.S. PATENT DOCUMENTS

| 6,684,358 | B1 | 1/2004 | Rajski |
| 6,993,694 | B1 | 1/2006 | Kapur |
| 7,032,148 | B2 * | 4/2006 | Wang et al. .................... 714/729 |
| 7,093,175 | B2 | 8/2006 | Rajski |
| 7,302,624 | B2 | 11/2007 | Rajski |
| 2006/0111873 | A1 | 5/2006 | Huang |
| 2009/0083597 | A1 * | 3/2009 | Gizdarski ...................... 714/729 |
| 2009/0254786 | A1 | 10/2009 | Cheng |
| 2011/0307750 | A1 * | 12/2011 | Narayanan et al. ........... 714/729 |

\* cited by examiner

*Primary Examiner* — Sam Rizk
(74) *Attorney, Agent, or Firm* — Charles Bergere

(57) ABSTRACT

Scan chains are used to detect faults in integrated circuits but with the size of today's circuits, it is difficult to detect and locate scan chain faults, especially when the scan data in and scan data out have been compressed. A method for debugging scan chains includes selecting a scan chain for debugging using a scan chain selection block and then providing scan test vectors to the selected scan chain. The scan test vectors undergo various scan test stages to generate scan response vectors. The scan response vectors are compared with ideal response vectors to identify a failing scan chain.

12 Claims, 2 Drawing Sheets

SYSTEM AND METHOD FOR DEBUGGING SCAN CHAINS

BACKGROUND OF THE INVENTION

The present invention relates generally to scan testing of digital circuits and more particularly, to debugging the scan chains used in scan testing.

Recent years have seen tremendous advancement in the fields of electronic devices, electronic circuit integration and printed circuit boards (PCB). Devices that contained ICs with a few hundred transistors a few decades ago, now include millions of transistors. These advancements have led to an increase in circuit density and considerable miniaturization in devices. However, miniaturization of devices has made circuit testing difficult. Traditional testing techniques, such as 'bed of nails' testing have not been able to provide accurate test results and proven to be expensive. Further, such test methodologies fail when used to test devices with multilayered PCBs, pitched packages, and double-sided surface mount boards.

To overcome the above-stated limitations of traditional test methodologies, scan testing has been developed. Scan testing entails shifting scan test vectors into integrated circuits (IC) through scan cells that are organized as one or more shift registers. The scan test vectors are applied to the internal logic of the ICs and the corresponding scan-out vectors are saved. Thereafter, the scan-out vectors are compared with ideal responses to determine whether the IC has any faults. An extension of scan testing involves providing compressed scan test data during scan testing. Test data compression capitalizes on an aspect of scan testing in which only a small percentage of scan cells need to be assigned specific values. The remaining scan cells can hold random values and are considered as 'don't care'. Thus, shifting-in and shifting-out fewer test values reduces the test data and test time.

Scan testing with test data compression entails organizing the scan cells as multiple scan chains, each of a shorter length, as compared to the scan chain lengths in customary scan testing without data compression. The scan chains are then driven by an on-chip decompressor, which loads the multiple scan chains simultaneously by decompressing the test data delivered to it. Thereafter, the IC is tested using the test data and responses of the IC to the test data are shifted out of the scan chains as response data. The response data is then compressed by an on-chip compressor and provided to an external comparator for comparing the response data with the ideal response data to determine whether the IC contains any faults.

Although the above technique provides the advantages of test time and test data reduction, this technique complicates the debug process required to detect and locate scan chain failures that are primarily due to silicon level failures. The existence of compressor and de-compressor logic prevents deterministic control and observation of patterns, which in turn leads to complication in the creation of custom chain patterns for debugging purposes. For example, it is quite challenging to generate test patterns with reduced activity for ruling out noise and IR drop issues. Thus, it would be beneficial to provide more controllability with regard to scan chain selection during debugging and more observability with regard to scan response vector observation, thereby facilitating the scan chain debug process and expediting the isolation of the faulty scan chains and failing scan cells.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
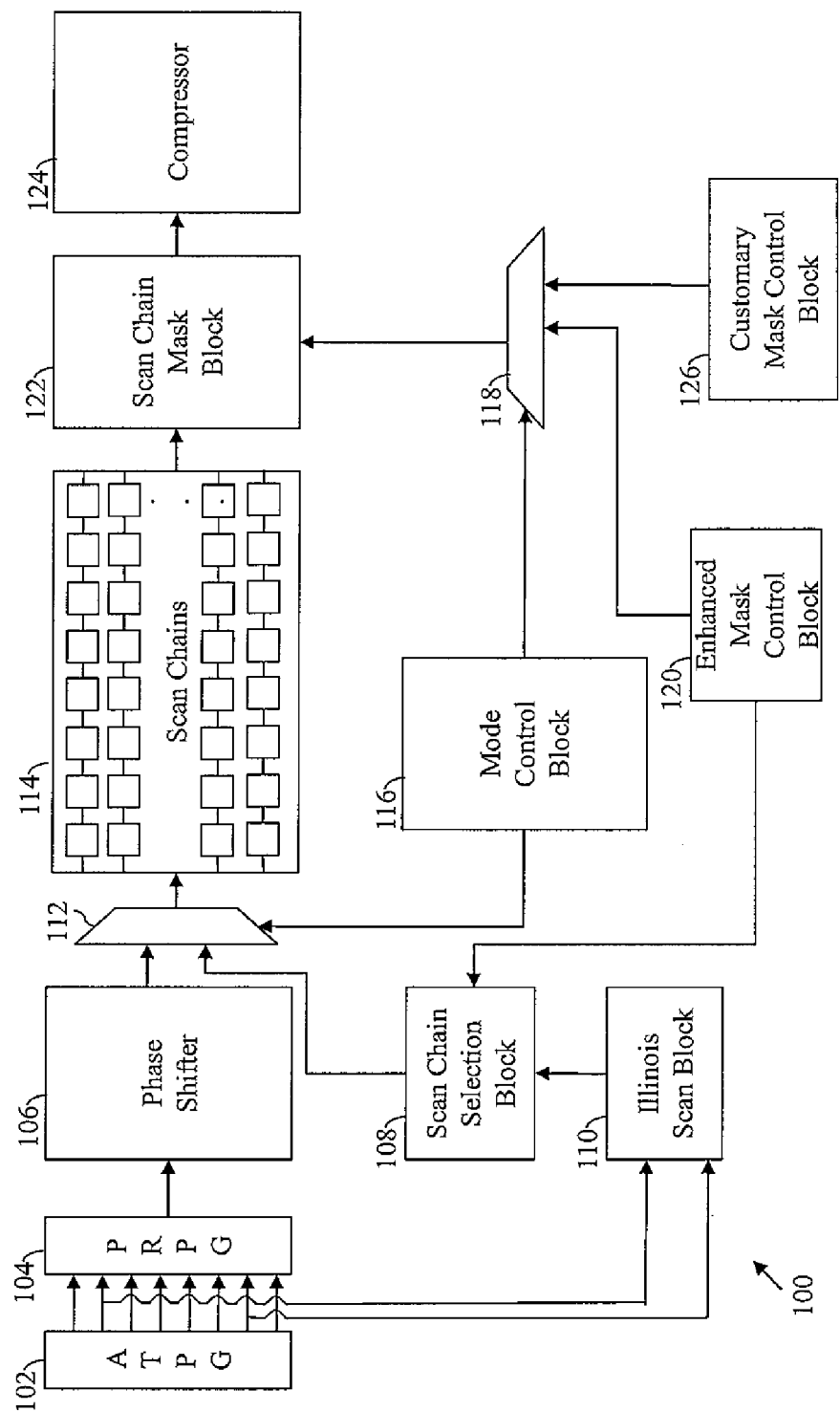
FIG. 1 is a schematic diagram illustrating a system for debugging scan chains in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for debugging one or more scan chains is provided. The system includes an Illinois scan block for providing scan test vectors to scan chains, in which the scan test vectors are provided in a broadcast Illinois scan mode. The system further includes a scan chain selection block, connected to the Illinois scan block, for selecting a scan chain to be provided the scan test vectors. Additionally, a scan chain mask block is connected to the one or more scan chains, for masking the one or more scan chains.

The system further includes, an enhanced mask control block, connected to the scan chain selection block, for controlling the scan chain selection block to select a scan chain for being provided the scan test vectors. The enhanced mask control block controls the scan chain mask block to mask the one or more scan chains. Further, a compressor, connected to the scan chain mask block, compresses the scan response vectors obtained from the scan chain mask block.

In another embodiment of the present invention, a system for debugging one or more scan chains is provided. The system includes an Illinois scan block for providing scan test vectors to the scan chains, in which the scan test vectors are provided in a broadcast Illinois scan mode. An automatic test pattern generator (ATPG), connected to the Illinois scan block, generates the scan test vectors and provides the scan test vectors to the Illinois scan block. Further, a decompressor, connected to the ATPG, decompresses the scan test vectors received from the ATPG, in which the decompressor randomizes the scan test vectors received from the ATPG. The decompressor includes a pseudo random pattern generator (PRPG) and a phase shifter for decompressing the scan test patterns. It should be realized by the person skilled in the art that, various other methods can be used for decompressing the scan test pattern. The invention should not be limited to the decompressing method described above. Further, a scan chain selection block is connected to the Illinois scan block and the scan chains, for selecting a scan chain to be provided the one or more scan test vectors. Still further, a first multiplexer is connected to the decompressor, the scan chain selection block, and the one or more scan chains, for providing the one or more scan test vectors received from either the decompressor or the scan chain selection block. The first multiplexer operates based on a first mode select signal generated by a mode control block connected to the first multiplexer. Further, a scan chain mask block is connected to the scan chains for masking the one or more scan chains. Furthermore, an enhanced mask control block is connected to the scan chain selection block, for controlling the scan chain selection block to select a scan chain for being provided the scan test vectors, in which the enhanced mask control block further controls the scan chain mask block to mask the one or more scan chains.

Additionally, the system includes a customary mask control, for controlling the scan chain mask block to mask the scan chains based on the value of the one or more scan response vectors obtained from the scan chains. In another embodiment of the present invention, a mask control different from the customary mask control is used. A second multiplexer is connected to the enhanced mask control block, the customary mask control block, and the mode control block, for providing a masking signal generated by either the enhanced mask control block or the customary mask control block. The second multiplexer operates based on a second mode select signal generated by the mode control block. Furthermore, a compressor, connected to the scan chain mask block, compresses one or more scan response vectors obtained from the scan chain mask block.

In yet another embodiment of the present invention, a method for debugging scan chains is provided. The method includes generating one or more scan test vectors for debugging the one or more scan chains, in which the one or more scan test vectors are generated by an ATPG. In an embodiment of the present invention ATPG is a software module. Thereafter, a scan chain is selected using a scan chain selection block. Subsequently, the selected scan chain is provided the scan test vectors using either an Illinois scan logic or a decompressor logic, in which the decompressor logic includes a PRPG and a phase shifter and the decompressor logic randomizes the scan test vectors. The scan chains, except the scan chain selected by the scan chain selection block, are then masked, in which the scan chains are masked by a scan chain mask block. Thereafter, the scan response vectors obtained from the scan chain are compressed.

Various embodiments of the present invention provide a system and method for debugging the scan chains. A scan chain selection block enables the selection of a scan chain for being debugged. The scan chain is then provided the scan test vectors generated using an Illinois scan logic. Further, the scan chains, except the scan chain selected for being provided the scan test patterns, are masked using a scan chain mask block that operates based on a masking signal generated by an enhanced mask control block. Therefore, the scan response vectors output from the unmasked scan chain are observed and compared with ideal scan response vectors to identify the failing scan chain.

Since, any of the scan chains may be selected using the scan chain selection block for debugging, complete controllability is provided to the user with regard to the scan chain selection. Further, since the scan chain mask block enables individual masking of the scan chains, complete observability is provided to the user with regard to observing the scan response vectors generated by a particular scan chain. Further, since any desired scan chain may be selected for loading the scan test vectors, low activity patterns may be created by loading constant values in the desired scan chain. Further, since the masking registers of the existing compression architecture are reused, the implementation of the present invention incurs a minor area overhead. Furthermore, the present invention is compatible with the existing ATPG architecture and ATPG tools, and therefore post-processing of patterns is not required. Additionally, the present invention enables the application of multiple customized chain patterns in the compression mode.

Referring to FIG. 1, a schematic diagram illustrating a system 100 for debugging scan chains in accordance with an embodiment is shown. System 100 includes an ATPG 102, a decompressor 104 which includes a pseudo random pattern generator (PRPG) 106 and a phase-shifter 108, a scan chain selection block 110, an Illinois scan block 112, multiplexers 114a and 114b, a scan chain block 116, a mode control block 118, an enhanced mask control block 120, a scan chain mask block 122, a customary mask control block 124, and a compressor 126.

Scan test data is generated by the ATPG 102. In an embodiment of the present invention, the scan test data includes multiple scan test vectors which are applied to the scan chains, present in the scan chain block 116, for detecting the faulty scan chains. The scan test patterns are then provided to either the decompressor 104 or to the Illinois scan block 112 based on the mode of operation of the system 100. In an embodiment of the present invention, the user may select either of a customary debug mode (that uses the decompressor 104) or an Illinois scan debug mode for debugging of the scan chains. When the system 100 operates in a customary debug mode, the scan test data is transmitted to the decompressor 104. The decompressor 104 randomizes the scan test vectors by using the PRPG 106 and the phase shifter 108. In an embodiment of the present invention, the PRPG 106 includes a serial shift register and the phase shifter 108 includes multiple XOR logic gates. The functioning of the PRPG 106 and the phase shifter 108 is well known in the art and has therefore been excluded from the present description for the sake of brevity. The randomized scan test data is then provided to the multiplexer 114a.

When the system 100 operates in the Illinois scan debug mode, the scan test vectors are provided to the Illinois scan block 112. In an embodiment of the present invention, the Illinois scan block 112 operates in a broadcast scan mode of transmitting scan test vectors. The broadcast scan mode of operation of the Illinois scan is well known in the art and therefore a detailed explanation has been excluded from the present description. The Illinois scan block 112 provides the scan test vectors in the broadcast mode to the scan chain selection block 110. The scan chain selection block 110 transmits the scan test vectors to the multiplexer 114a. The scan test vectors transmitted to the multiplexer 114a is assigned a scan chain destination (present in the scan chain block 116), such that the test vectors is transmitted only to that scan chain. The selection of the scan chain to which the scan test vectors are transmitted is performed by the scan chain selection block 110 based on an input signal received from the enhanced mask control block 120. The enhanced mask control block 120 in turn operates based on inputs received from a user with regard to the scan chain to which the user intends to transmit the scan test vectors. Thus, the enhanced mask control block 120 controls the scan chain selection block 110 to select a scan chain for being provided the scan test vectors, thereby enabling the user to select one scan chain of the multiple scan chains present in the scan chain block 116.

The multiplexer 114a selects either of the scan test vectors received from the decompressor 104 and the scan chain selection block 110 based on a first mode select signal generated by the mode control block 118. The mode select signal indicates to the multiplexer 114a an operating mode, viz. the customary debug mode or the Illinois scan debug mode, in which the system 100 is operating. A user intending to debug the scan chains to detect the failing scan chains, will preferably operate the system in the Illinois scan debug mode, since it enables the user to select one scan chain per debug cycle, thereby providing scan chain selectivity. Further, the Illinois scan block 112 provides a better control on loading the data from external pins as compared to existing decompressor. The user repeats the process for all the scan chains until the failing scan chains have been isolated. Subsequent to selecting the scan test vectors, the multiplexer 114a transmits the selected scan test vectors to the scan chain belonging to the scan chain block 116 selected for debugging by the user. The scan test vectors then proceed through the various stages of scan testing, viz. shift-in, capture, shift-out to generate the scan response vectors. The scan response vectors are then provided to the scan chain mask block 122. The scan chain mask block 122 masks the scan response vectors received from the one or more scan chains based on a masking signal received from the multiplexer 114b. The multiplexer 114b transmits the masking signal selected from the masking signals received from the enhanced mask control block 120 or the customary mask control block 124. The multiplexer 114b performs the selection based on a second mode control signal. The second mode control signal is generated by the mode control block 118 based on the masking logic that the user intends to use. For example, in a scenario when the user intends to receive the scan response vectors from a desired scan chain, the second mode control signal controls the multiplexer 114b to select the masking signal generated by the enhanced mask control block 120. The masking signal generated by the enhanced mask control block 120 controls the scan chain mask block 122 to mask the scan chains other than the scan chain from which the user intends to receive the scan response vectors. Thus, the enhanced mask control block 120 enables the user to individually observe scan response vectors from any of the scan chains. This facilitates the scan chain debug process, since the user may select one of the scan chains selected by the scan chain selection block 110 to provide the scan test vectors and receive the scan response data from the scan chain. Thus, the debug procedure becomes simplified and deterministic. In an embodiment of the present invention, the scan chain mask block is a series of logic gates connected in a manner to enable selective masking of scan chains. A person skilled in the art will appreciate that the AND or OR logic gates can be used for to enable selective masking of scan chains.

Further, the user may intend to use the customary masking process. It should be realized by persons skilled in the art that the customary masking process entails controlling the scan chain mask block 122 to mask one or more scan chains based on the value of scan response vectors output by the scan chains. In such a scenario the second mode control signal controls the multiplexer 114b to select the masking signal generated by the customary mask control block 124. Subsequently, the scan response vectors are compressed by the compressor 126. Thereafter, the scan response vectors are compared with ideal responses to identify the failing scan chains. As a result, the present invention provides deterministic control, which is not provided by the customary module.

Figure 2:
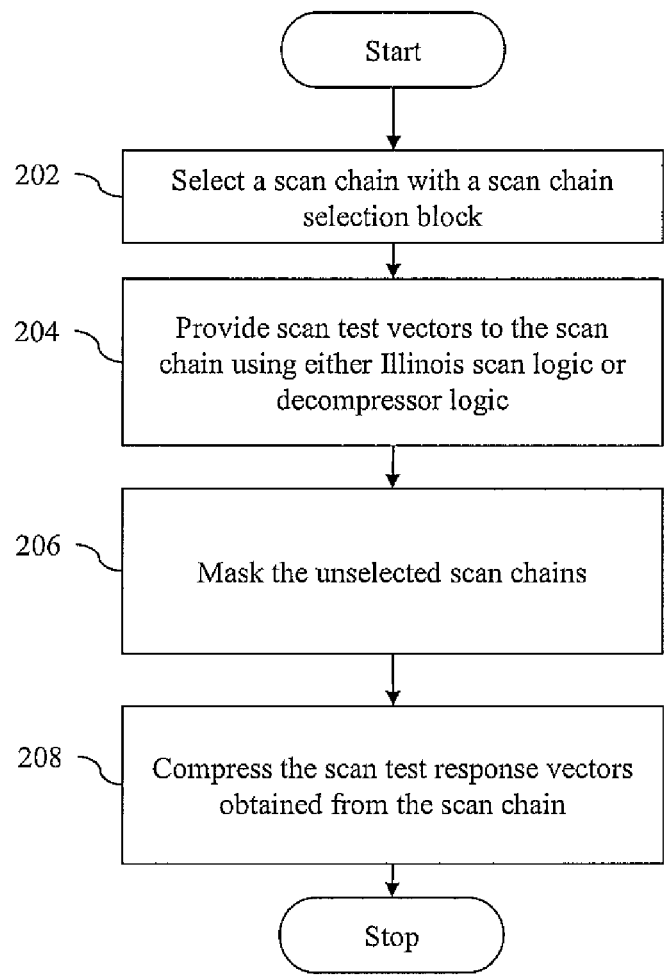
FIG. 2 is a flowchart illustrating a method for debugging scan chains in accordance with an embodiment of the present invention.

Referring to FIG. 2, a flowchart 200 illustrating a method for debugging scan chains in accordance with an embodiment of the present invention is shown. The flowchart 200 is explained below in conjunction with FIG. 1.

At step 202, one of the scan chains belonging to a scan chain block, such as the scan chain block 116 (refer FIG. 1) to be debugged is selected. The scan chain is selected using a scan chain selection block, such as the scan chain selection block 110 which in turn receives control signals from an enhanced mask control block, such as the enhanced mask control block 120 for selecting the debug scan chain. At step 204, the scan test vectors are provided to the selected scan chain either using the Illinois scan logic (Illinois scan block 112) or the decompressor logic (decompressor 104). The scan test vectors are provided using either of the above two stated logics based on mode of operation as mentioned above. Thereafter, the scan test vectors proceed through the various shift-in, capture, and shift-out stages and are output as the scan response vectors.

At step 206, the various scan chains are masked except for the scan chain that was selected for debugging, thereby enabling the user to observe the scan response vectors output specifically from the debug scan chain. The masking of the scan chain is performed by a scan chain mask block, such as the scan chain mask block 122 (refer FIG. 1), based on a masking signal. The masking signal used for masking the scan chains is generated by the enhanced mask control block. Further, the user may intend to perform masking using the customary masking process in which the masking is performed based on the value of the scan response vectors obtained from the scan chain. In such a scenario the masking signal generated by the customary mask control block is used to control the scan chain mask block. At step 208, the scan response vectors obtained from the debug scan chain are compressed by a compressor, such as the compressor 126. Thereafter, the compressed scan response vectors are compared with ideal scan response vectors to identify the failing scan chains.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for testing a scan chain, comprising:
    a scan block for providing a scan test vector to the scan chain;
    a scan chain selection block, connected to the scan block, for selecting the scan chain to be provided with the scan test vector;
    a scan chain mask block, connected to the scan chain, for masking the scan chain and generating a scan test response vector; and
    an enhanced mask control block, connected to the scan chain selection block and the scan chain mask block, for controlling the scan chain selection block to select the scan chain to be provided with the scan test vector and controlling the scan chain mask block to mask the scan chain; and
    a compressor, connected to the scan chain mask block, for compressing the scan test response vector obtained from the scan chain mask block.

2. The scan chain testing system of claim 1, wherein the scan test vector is received by way of a chip pin.

3. The scan chain testing system of claim 1, wherein the scan test vector is generated on-chip.

4. The scan chain testing system of claim 1, further comprising, an automatic test pattern generator (ATPG), connected to the scan block, for generating the scan test vector and providing the scan test vector to the scan block.

5. The scan chain testing system of claim 4, further comprising a decompressor, connected to the ATPG, for decompressing the scan test vector received from the ATPG, wherein the decompressor randomizes the scan test vector received from the ATPG.

6. The scan chain testing system of claim 5, further comprising:
a first multiplexer, connected to the decompressor, the scan chain selection block, and the scan chain, for providing the scan test vector received from at least one of the decompressor and the scan chain selection block; and
a mode control block for providing a first mode select signal to the first multiplexer to control an output of the first multiplexer.

7. The scan chain testing system of claim 6, wherein the mode control block generates a second mode select signal, the system further comprising:
a customary mask control block, connected to the scan chain mask block, for controlling the scan chain mask block to mask the scan chain based on the scan test response vector; and
a second multiplexer, connected to the enhanced mask control block, the customary mask control block, and the mode control block, for providing a mask signal generated by at least one of the enhanced mask control block and the customary mask control block, wherein the second multiplexer operates based on a second mode select signal generated by the mode control block.

8. A system for testing a scan chain, comprising:
an automatic test pattern generator (ATPG) for generating a scan test vector;
a scan block, connected to the ATPG, that receives the scan test vector and provides the scan test vector to the scan chain;
a decompressor, connected to the ATPG, for decompressing the scan test vector received from the ATPG;
a scan chain selection block, connected between the scan block and the scan chain, for selecting the scan chain to be provided with the scan test vector from a plurality of scan chains;
a mode control block for generating a first mode select signal;
a first multiplexer having a first data input connected to the decompressor, a second data input connected to the scan chain selection block, and an output connected to the scan chain, wherein the first multiplexer provides the scan test vector received from one of the decompressor and the scan chain selection block, and wherein the first multiplexer operates based on the first mode select signal;
a scan chain mask block, connected to the output of the scan chain, for masking a scan response vector received from the scan chain;
an enhanced mask control block, connected to the scan chain selection block, for controlling the scan chain selection block to select the scan chain to be provided with the scan test vector, wherein the enhanced mask control block also controls the scan chain mask block;
a customary mask control block for controlling the scan chain mask block to mask the scan chain based on the scan test response vector obtained from the scan chain;
a second multiplexer, connected to the enhanced mask control block, the customary mask control block, and the mode control block, for providing a masking signal generated by at least one of the enhanced mask control block and the customary mask control block, wherein the second multiplexer operates based on a second mode select signal generated by the mode control block; and
a compressor, connected to the scan chain mask block, for compressing the scan test response vector obtained from the scan chain mask block.

9. The scan chain testing system of claim 8, wherein the decompressor randomizes the scan test vector received from the ATPG.

10. A method for testing a scan chain, comprising:
selecting a scan chain from a plurality of scan chains;
providing a scan test vector to the selected scan chain using at least one of a scan logic and a decompressor logic, wherein the decompressor logic randomizes the scan test vector;
receiving a scan test response vector from the selected scan chain;
masking the non-selected scan chains; and
compressing the scan test response vector.

11. The method of claim 10, wherein providing the scan test vector comprises providing the scan test vector in a broadcast mode.

12. The method of claim 10, further comprising loading constant data into the non-selected scan chains.

* * * * *